US008916471B1

(12) United States Patent
Yang et al.

(10) Patent No.: US 8,916,471 B1
(45) Date of Patent: Dec. 23, 2014

(54) METHOD FOR FORMING SEMICONDUCTOR STRUCTURE HAVING THROUGH SILICON VIA FOR SIGNAL AND SHIELDING STRUCTURE

(71) Applicant: United Microelectronics Corp., Hsin-Chu (TW)

(72) Inventors: Ching-Li Yang, Ping-Tung Hsien (TW); Chien-Li Kuo, Hsinchu (TW); Chung-Sung Chiang, Kaohsiung (TW); Yu-Han Tsai, Kaohsiung (TW); Chun-Wei Kang, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/975,382

(22) Filed: Aug. 26, 2013

(51) Int. Cl.
| | |
|---|---|
| *H01L 21/44* | (2006.01) |
| *H01L 29/40* | (2006.01) |
| *H01L 21/768* | (2006.01) |
| *H01L 23/552* | (2006.01) |
| *H01L 23/538* | (2006.01) |

(52) U.S. Cl.
CPC .... *H01L 21/76877* (2013.01); *H01L 21/76802* (2013.01); *H01L 23/552* (2013.01); *H01L 23/5384* (2013.01); *H01L 2225/06541* (2013.01); *H01L 2924/3025* (2013.01); *H01L 21/76898* (2013.01); *H01L 21/76897* (2013.01)
USPC .......................................... 438/667; 257/621

(58) Field of Classification Search
CPC ................... H01L 23/5384; H01L 2924/3025; H01L 2225/06542; H01L 21/76897; H01L 21/76898

USPC .................................. 438/666–668; 257/621
See application file for complete search history.

(56) References Cited

U.S. PATENT DOCUMENTS

| | | | |
|---|---|---|---|
| 3,150,299 | A | 9/1964 | Noyce |
| 3,256,465 | A | 6/1966 | Weissenstern |
| 3,323,198 | A | 6/1967 | Shortes |
| 3,343,256 | A | 9/1967 | Smith |
| 3,372,070 | A | 3/1968 | Zuk |
| 3,462,650 | A | 8/1969 | Hennings |
| 3,648,131 | A | 3/1972 | Stuby |
| 4,394,712 | A | 7/1983 | Anthony |
| 4,395,302 | A | 7/1983 | Courduvelis |
| 4,616,247 | A | 10/1986 | Chang |
| 4,773,972 | A | 9/1988 | Mikkor |
| 4,939,568 | A | 7/1990 | Kato |
| 5,214,000 | A | 5/1993 | Chazan |
| 5,229,647 | A | 7/1993 | Gnadinger |
| 5,286,926 | A | 2/1994 | Kimura |
| 5,372,969 | A | 12/1994 | Moslehi |
| 5,399,898 | A | 3/1995 | Rostoker |
| 5,463,246 | A | 10/1995 | Matsunami |
| 5,484,073 | A | 1/1996 | Erickson |
| 5,502,333 | A | 3/1996 | Bertin |

(Continued)

*Primary Examiner* — Karen Kusumakar
(74) *Attorney, Agent, or Firm* — Winston Hsu; Scott Margo

(57) ABSTRACT

A method for forming a through silicon via for signal and a shielding structure is provided. A substrate is provided and a region is defined on the substrate. A radio frequency (RF) circuit is formed in the region on the substrate. A through silicon trench (TST) and a through silicon via (TSV) are formed simultaneously, wherein the TST encompasses the region to serve as a shielding structure for the RF circuit. A metal interconnection system is formed on the substrate, wherein the metal interconnection system comprises a connection unit that electrically connects the TSV to the RF circuit to provide a voltage signal.

19 Claims, 7 Drawing Sheets

(56) References Cited

U.S. PATENT DOCUMENTS

| | | | | |
|---|---|---|---|---|
| 5,627,106 | A | 5/1997 | Hsu | |
| 5,793,115 | A | 8/1998 | Zavracky | |
| 5,977,640 | A | 11/1999 | Bertin | |
| 6,018,196 | A | 1/2000 | Noddin | |
| 6,143,616 | A | 11/2000 | Geusic | |
| 6,274,937 | B1 | 8/2001 | Ahn | |
| 6,309,956 | B1 | 10/2001 | Chiang | |
| 6,391,777 | B1 | 5/2002 | Chen | |
| 6,407,002 | B1 | 6/2002 | Lin | |
| 6,440,640 | B1 | 8/2002 | Yang | |
| 6,483,147 | B1 | 11/2002 | Lin | |
| 6,525,419 | B1 | 2/2003 | Deeter | |
| 6,548,891 | B2 | 4/2003 | Mashino | |
| 6,551,857 | B2 | 4/2003 | Leedy | |
| 6,627,985 | B2 | 9/2003 | Huppenthal | |
| 6,633,083 | B2 | 10/2003 | Woo | |
| 6,746,936 | B1 | 6/2004 | Lee | |
| 6,778,275 | B2 | 8/2004 | Bowes | |
| 6,800,930 | B2 | 10/2004 | Jackson | |
| 6,812,193 | B2 | 11/2004 | Estes | |
| 6,831,013 | B2 | 12/2004 | Tsai | |
| 6,897,148 | B2 | 5/2005 | Halahan | |
| 6,924,551 | B2 | 8/2005 | Rumer | |
| 6,930,048 | B1 | 8/2005 | Li | |
| 7,034,401 | B2 | 4/2006 | Savastiouk | |
| 7,052,937 | B2 | 5/2006 | Clevenger | |
| 7,075,133 | B1 | 7/2006 | Padmanabhan | |
| 7,098,070 | B2 | 8/2006 | Chen | |
| 7,111,149 | B2 | 9/2006 | Eilert | |
| 7,166,913 | B2 | 1/2007 | Chinthakindi | |
| 7,222,420 | B2 | 5/2007 | Moriizumi | |
| 7,282,951 | B2 | 10/2007 | Huppenthal | |
| 7,323,785 | B2 | 1/2008 | Uchiyama | |
| 7,338,896 | B2 | 3/2008 | Vanhaelemeersch | |
| 7,402,515 | B2 | 7/2008 | Arana | |
| 7,432,592 | B2 | 10/2008 | Shi | |
| 7,531,415 | B2 | 5/2009 | Kwok | |
| 7,541,677 | B2 | 6/2009 | Kawano | |
| 7,564,115 | B2 | 7/2009 | Chen | |
| 7,598,607 | B2 | 10/2009 | Chung | |
| 7,633,165 | B2 | 12/2009 | Hsu | |
| 7,732,926 | B2 | 6/2010 | Uchiyama | |
| 7,795,735 | B2 | 9/2010 | Hsu | |
| 7,812,426 | B2 | 10/2010 | Peng | |
| 7,816,227 | B2 | 10/2010 | Chen | |
| 7,825,024 | B2 | 11/2010 | Lin | |
| 7,825,517 | B2 | 11/2010 | Su | |
| 7,843,064 | B2 | 11/2010 | Kuo | |
| 7,846,837 | B2 | 12/2010 | Kuo | |
| 7,851,346 | B2 | 12/2010 | Lee | |
| 7,928,534 | B2 | 4/2011 | Hsu | |
| 7,929,313 | B2 * | 4/2011 | Ito et al. | 361/765 |
| 7,932,608 | B2 | 4/2011 | Tseng | |
| 7,939,941 | B2 | 5/2011 | Chiou | |
| 7,955,895 | B2 | 6/2011 | Yang | |
| 7,956,442 | B2 | 6/2011 | Hsu | |
| 7,969,013 | B2 | 6/2011 | Chen | |
| 8,026,592 | B2 | 9/2011 | Yoon | |
| 8,034,708 | B2 | 10/2011 | Kuo | |
| 8,049,327 | B2 | 11/2011 | Kuo | |
| 8,053,873 | B2 | 11/2011 | Chauhan | |
| 8,053,898 | B2 | 11/2011 | Marcoux | |
| 8,053,900 | B2 | 11/2011 | Yu | |
| 8,053,902 | B2 | 11/2011 | Chen | |
| 8,063,496 | B2 | 11/2011 | Cheon | |
| 8,344,512 | B2 | 1/2013 | Knickerbocker | |
| 8,492,241 | B2 * | 7/2013 | Cheng et al. | 438/447 |
| 2001/0038972 | A1 | 11/2001 | Lyons | |
| 2004/0080041 | A1 | 4/2004 | Kimura | |
| 2004/0188817 | A1 | 9/2004 | Hua | |
| 2005/0112997 | A1 | 5/2005 | Lin | |
| 2005/0136635 | A1 | 6/2005 | Savastiouk | |
| 2005/0205991 | A1 | 9/2005 | Chen | |
| 2006/0035146 | A1 | 2/2006 | Hayashi | |
| 2006/0042834 | A1 | 3/2006 | Lee | |
| 2007/0117348 | A1 | 5/2007 | Ramanathan | |
| 2007/0126085 | A1 | 6/2007 | Kawano | |
| 2007/0190692 | A1 | 8/2007 | Erturk | |
| 2008/0073747 | A1 | 3/2008 | Chao | |
| 2008/0108193 | A1 | 5/2008 | You | |
| 2009/0127667 | A1 | 5/2009 | Iwata | |
| 2009/0134498 | A1 | 5/2009 | Ikeda | |
| 2009/0180257 | A1 | 7/2009 | Park | |
| 2009/0224405 | A1 | 9/2009 | Chiou | |
| 2010/0001379 | A1 | 1/2010 | Lee | |
| 2010/0041203 | A1 * | 2/2010 | Collins et al. | 438/386 |
| 2010/0140749 | A1 * | 6/2010 | Kuo | 257/621 |
| 2010/0140772 | A1 | 6/2010 | Lin | |
| 2010/0244247 | A1 | 9/2010 | Chang | |
| 2010/0323478 | A1 | 12/2010 | Kuo | |
| 2011/0027962 | A1 * | 2/2011 | Bernstein et al. | 438/386 |

* cited by examiner

US 8,916,471 B1

METHOD FOR FORMING SEMICONDUCTOR STRUCTURE HAVING THROUGH SILICON VIA FOR SIGNAL AND SHIELDING STRUCTURE

BACKGROUND OF THE INVENTION

1. Field of the Invention

The present invention relates to a semiconductor device having a shield structure, and more particularly, to a semiconductor device having a shield structure that can reduce the electromagnetic interference (EMI).

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed, thereby forming a package body.

In the modern society, current semiconductor devices often include RF circuit to perform wireless communication capabilities. However, there is often strong EMI generated by the RF circuit, which would interfere other around circuits. It is a serious problem which is urged to be resolved.

SUMMARY OF THE INVENTION

The present invention therefore provides a method for forming a semiconductor device having a through silicon via which is used for interconnection and a shield structure which is used for avoiding the EMI problem for the RF circuit.

According to one embodiment, a method for forming a through silicon via for signal and a shielding structure is provided. A substrate is provided and a region is defined on the substrate. A radio frequency (RF) circuit is formed in the region on the substrate. A through silicon trench (TST) and a through silicon via (TSV) are formed simultaneously, wherein the TST encompasses the region to serve as a shielding structure for the RF circuit. A metal interconnection system is formed on the substrate, wherein the metal interconnection system comprises a connection unit which electrically connects the TSV and the RF circuit to provide a voltage signal.

The present invention provides a method of forming a semiconductor device having a shielding structure, which can effectively eliminate the phenomenon of EMI from the RF circuits, and a TSV for signal connection. Since the TST and the TSV are formed simultaneously, the cost and the time can be saved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
FIG. 1 to FIG. 7 illustrate schematic diagrams of the method of forming a semiconductor device having a TSV for interconnection and a shield structure according to one embodiment of the present invention.

Please refer to FIG. 1 to FIG. 7, which illustrate schematic diagrams of the method of forming a semiconductor device having a TSV for interconnection and a shield structure according to one embodiment of the present invention. As shown in FIG. 1, a substrate 300 is provided. The substrate 300 includes a semiconductor material. For example, the substrate 300 can be a silicon substrate, an epitaxial silicon substrate, a silicon germanium substrate, a silicon carbide substrate or a silicon-on-insulator substrate, but is not limited thereto. The substrate 300 has an active surface 301 and a back surface 303, which are disposed opposite to each other. A plurality of passive or active electrical units (not shown) will be formed in and/or on the substrate 300 at a side of the active surface 301 in the following steps.

Figure 2:
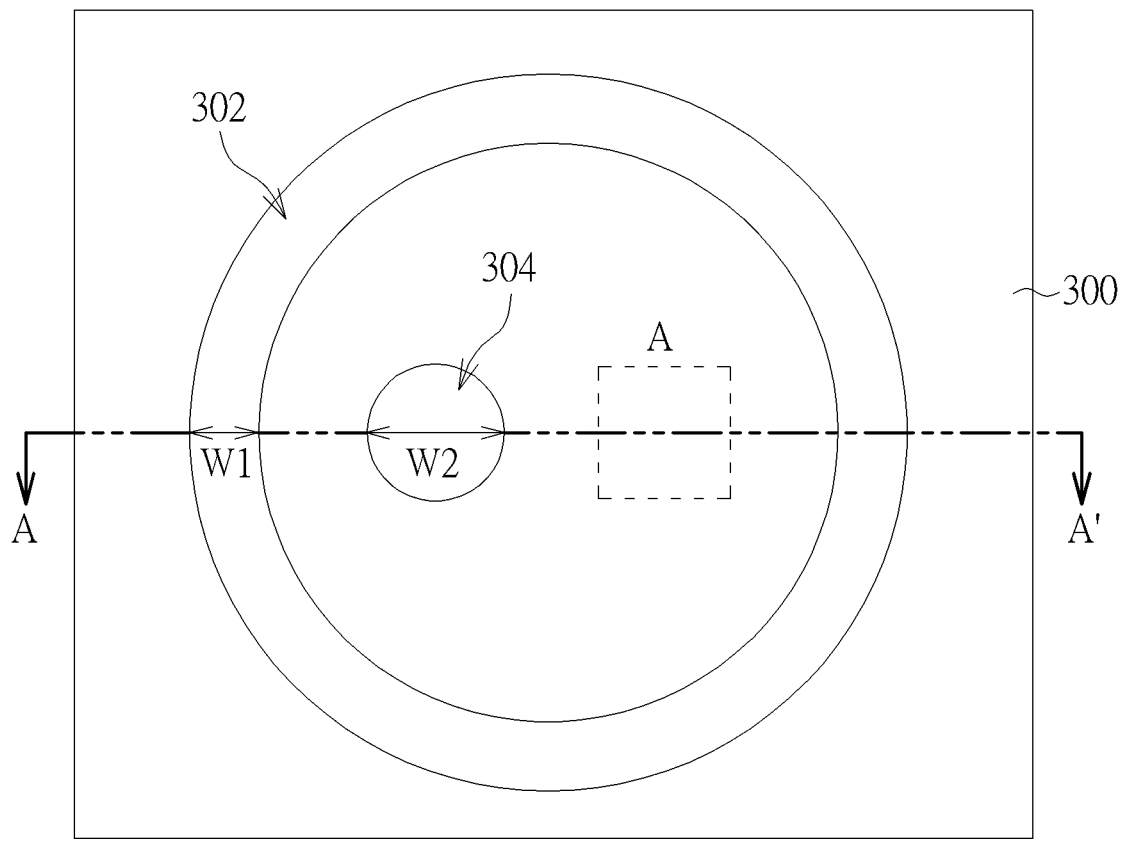
Figure 3:
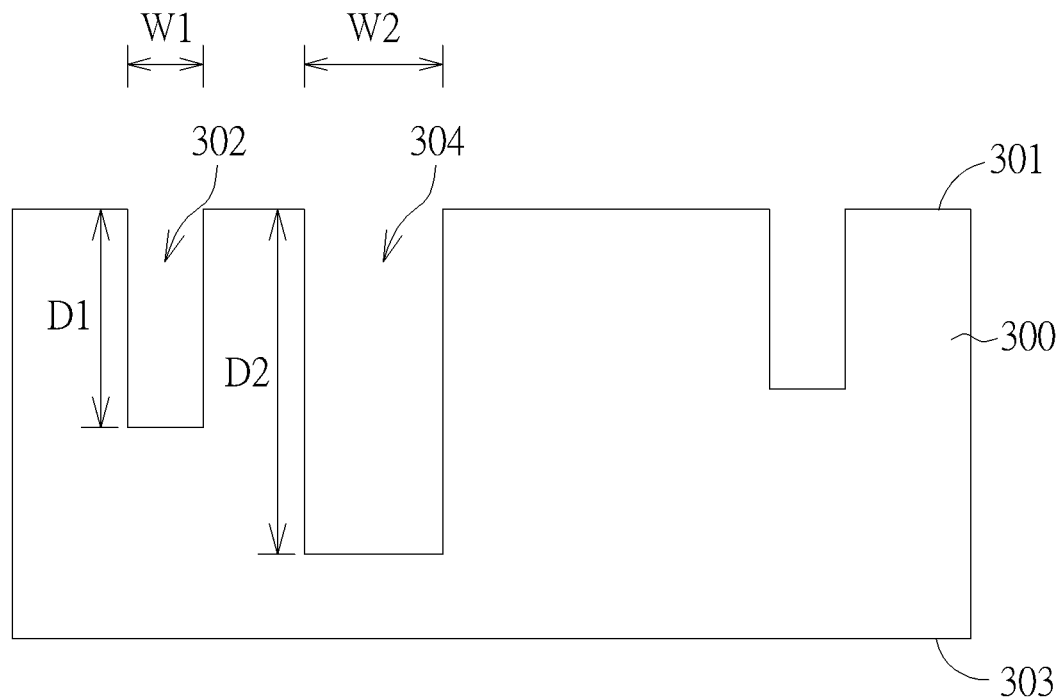
Figure 4:
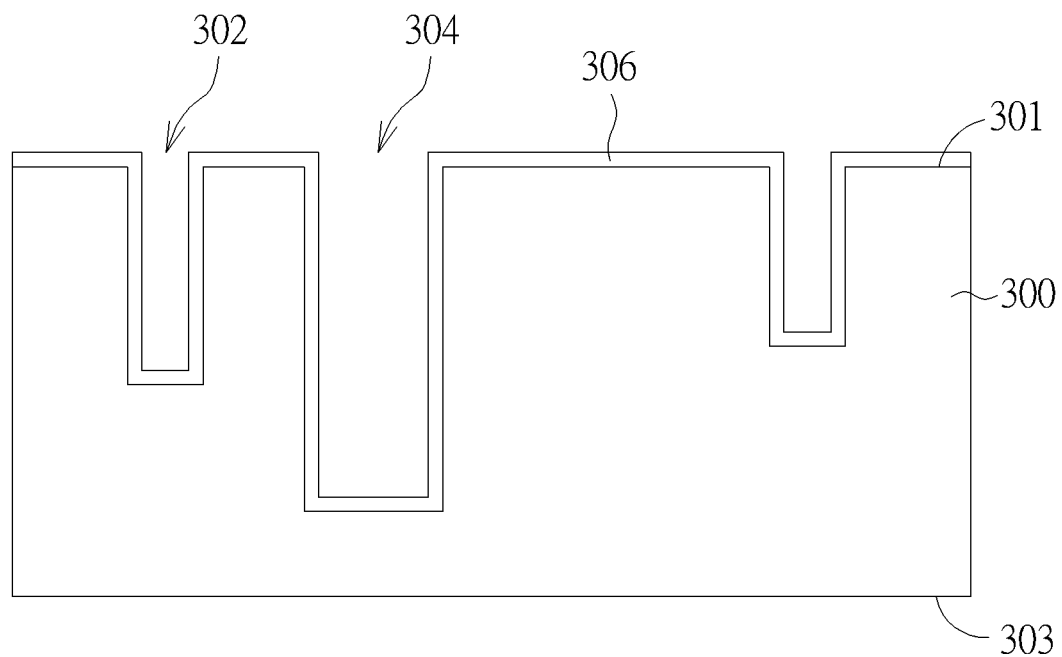
Figure 5:
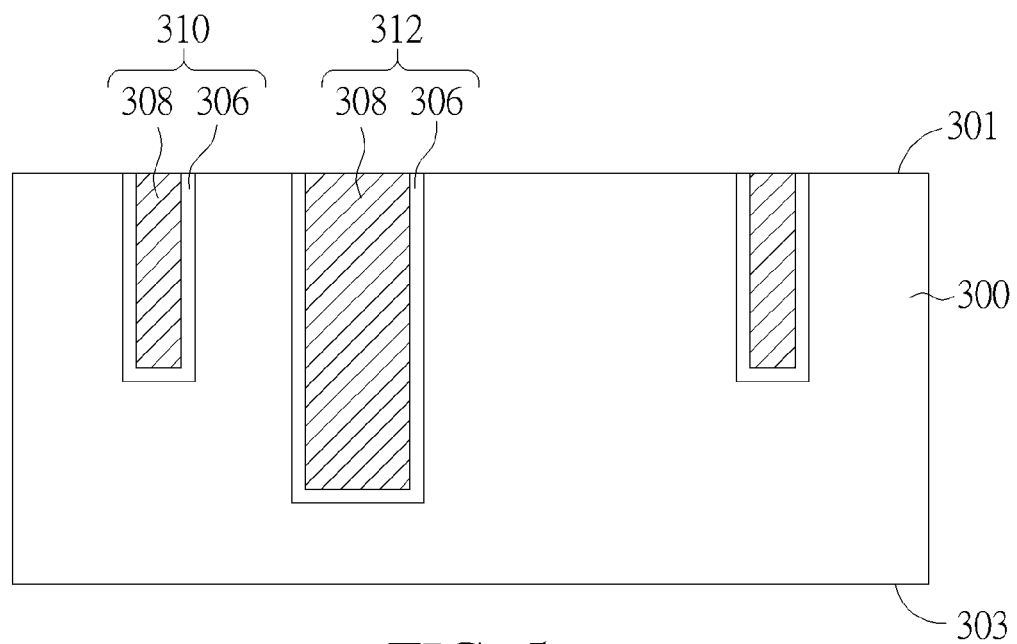

Next, as shown in FIG. 5, a through silicon trench (TST) 310 and a through silicon via (TSV) 312 are formed simultaneously on the substrate 300. For the detail description, please refer to FIG. 2 to FIG. 5, wherein FIG. 2 is a top view and FIG. 3 to FIG. 5 are cross-sectional view taken along line AA' in FIG. 2. With reference to FIG. 2 and FIG. 3, a via 304 and a trench 302 are formed in the substrate 300 at the side of the active surface 301, in which the trench 302 surrounds the via 304. In one embodiment, the dimension of the trench 302 is smaller than that of the via 304. For example, the width W1 of the trench 302 is smaller than the width W2 of the via, and the depth D1 of the trench 302 is smaller than the depth D2 of the via 304. Since during an etching process, the bigger the aperture is, the deeper the opening can be formed. The trench 302 and the via 304 can be therefore formed simultaneously by one single photo-etching-process (PEP) in the present invention. As a result, with comparison to conventional arts that uses two PEPs to separately form the trench 302 and the via 304, the cost and time can be saved in the present invention. In one embodiment, the width W2 is about 10 to 1.5 times of the width W1, preferably, 5 to 2 times. For example, when the width W2 is about 50 micro meters, the width W1 is about 10 micro meters. There is no strict limitation for ratio between the depth D1 and the depth D2, however, the depth D1 should be smaller than the depth D2.

With reference to FIG. 4, an insulation layer 306 is formed on the substrate 300 to conformally cover a surface of the trench 302 and the via 304. The insulation layer 306 can be formed by a chemical vapor deposition (CVD) process, a physical vapor deposition (PVD) process or a thermal oxidization process and the material thereof can be any insulation material. In one embodiment, the insulation layer 306 is a $SiO_2$ layer and is formed by a thermal oxidation process. Subsequently, an optional barrier layer (not shown) and an optional seed layer not shown are sequentially formed on the insulation layer 306. The barrier layer and the seed layer are formed conformally along the sidewall and the bottom surface of the trench 302 and the via 304. In one embodiment, the barrier layer is nitride titanium (TiN), titanium (Ti), tantalum nitride (TaN), tantalum (Ta) or combinations thereof, and the seed layer is a copper seed layer.

With reference to FIG. 5, a conductive layer 308 is formed in the trench 302 and the via 304 to completely fill the trench 302 and the via 304. The conductive layer 308 includes metal such as Cu, Al, Ti, Ta, W, Nb, Mo, TiN, TiC, TaN, Ti/W or Ti/TiN, but is not limited thereto. Preferably, the conductive layer 308 is copper. A planarization process such as a chemical mechanical polish (CMP) is applied to the active surface 301 so as to remove the conductive layer 308, the optional barrier layer, the insulation layer 306 outside the trench 302 and the via 308. Thus, the conductive layer 308 and the insulation layer 306 located in the trench 302 become the through silicon trench 310 (TST), and the conductive layer 308 and the insulation layer 306 located in the via 304 become the through silicon via (TSV) 312, simultaneously.

It is noted that the term "simultaneously forming the TST 310 and the TSV 312" means that after the planarization process, the structure including the TST 310 and the TSV 312 as shown in FIG. 5 is formed. As shown above, there are three steps carried out to form the TST 310 and the TSV 312, for example, the trench 302/via 304 forming step (FIG. 3), the insulation layer 306 forming step (FIG. 4) and the conductive layer 308 forming step (FIG. 5). In the present invention, at least one of the three steps is carried out simultaneously. Preferably, the step of forming the trench 302/via 304 is carried out simultaneously, and the other two steps can be carried out separately and respectively for the trench 302 and the via 304. For example, the trench 302 and the via 304 are formed simultaneously, but the insulation layer can be formed separately into the trench 302 and the via 304 so the thickness or the material of the insulation layer in the trench 302 and the via 304 can be different, and then the conductive layer 308 is formed simultaneously into the trench 302 and the via 304. In another embodiment, the trench 302 and the via 304 are formed simultaneously, the insulation layer 306 is formed simultaneously in the trench 302 and the via 304, but the conductive layer can be formed separately into the trench 302 and the via 304 so the material of the conductive layer can be different in the trench 302 from that in the via 304.

Figure 6:
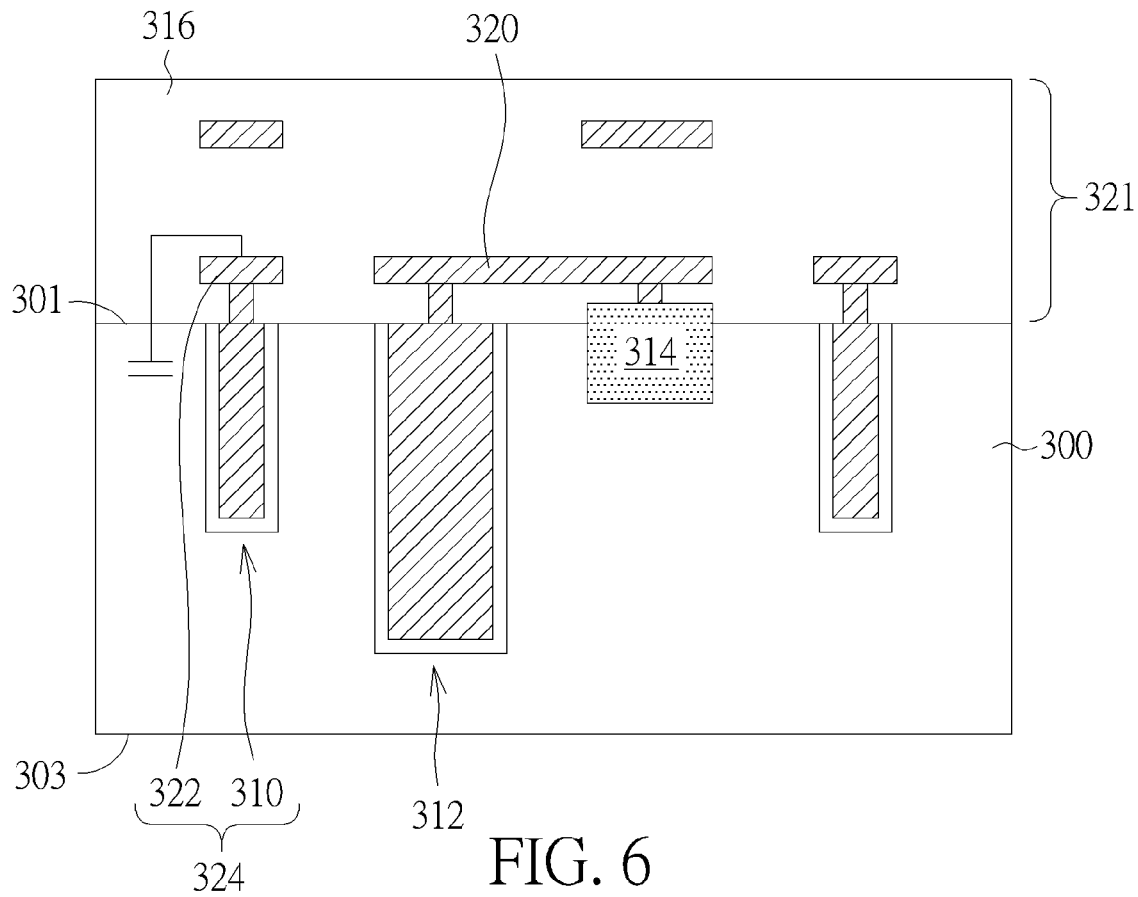

After forming the TST 310 and the TSV 312, as shown in FIG. 6, a radio frequency (RF) circuit 314 is formed in/on the substrate 302 at the side of the active surface 301 and is encompassed by the TST 310. Please also see FIG. 2, which shows the corresponding area A where the RF circuit 314 is formed therein. It is shown from FIG. 2 that the TST 310 surrounds the RF circuit 314, preferably surrounds both the RF circuit 314 and the TSV 312. In the present invention, the RF circuit 314 refers to the circuits that are able to send or receive radio waves of a certain frequency, for example, 1900 M Hz to 900 M Hz used in mobile communication circuit, or 2.4 G Hz used in a Bluetooth communication circuit, or 6 G Hz used in other communication system. The RF circuit 314 may include a plurality of active or passive electronic components (not shown). In the present embodiment, the RF circuit 314 is formed after the TST 310 and the TSV 312. In another embodiment, the RF circuit 314 is formed before the TST 310 and the TSV 312. Next, as shown in FIG. 6, a dielectric layer 316 and a metal interconnection system 321 are formed on the active surface 301 of the substrate 300. The dielectric layer 316 can contain multiple layers of the same or different dielectric materials, such as silicon oxide ($SiO_2$), tetraethyl orthosilicate (TEOS), plasma-enhanced-tetraethyl orthosilicate (PETEOS), porous sol-gel, or other low k materials, and is not limited thereto. The metal interconnect system 321 is disposed in the dielectric layer 316 and can be formed by different conventional metal interconnection forming processes, such as an aluminum process, a via plug process, a Cu damascene process or a combination thereof. In one embodiment, the metal interconnection system 321 includes at least a connection unit 320 and a shielding unit 322. The connection unit 320 electrically connects the RF circuit 314 and the TSV 312. The shielding unit 322 directly contacts the TST 310 so the shielding unit 322 and the TST 310 together form a shielding structure 324. Alternatively, the shielding unit 322 does not directly connect the TST 310 and can be electrically floating. In another embodiment, the shielding unit 322 can be omitted.

Figure 7:
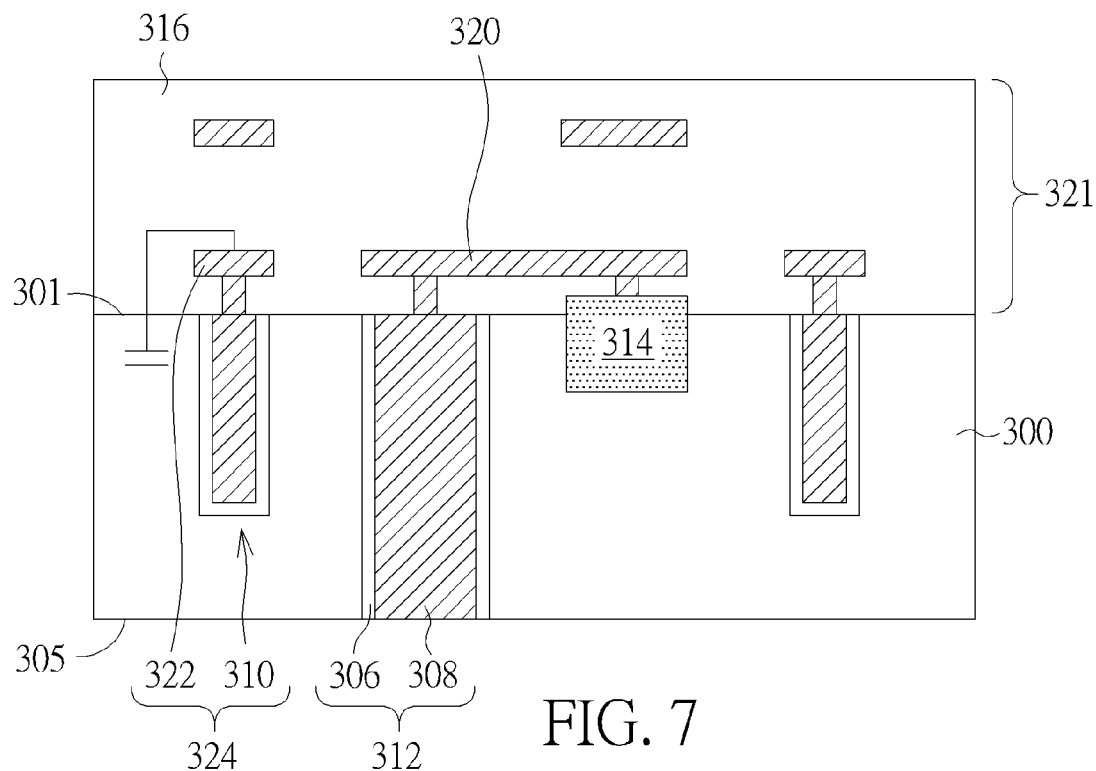

With reference to FIG. 7, a thinning process is performed from the back surface 303 of the substrate 300 so the back surface 303 becomes a back surface 305. Thereafter, the TSV 312, preferably the conductive layer 308 of the TSV 312, is exposed, but the TST 310 is not exposed. In the present invention, the TSV 312 is used for connecting a voltage signal (not shown) for the RF circuit 314 via the connection unit 320. The voltage signal, such as an input/output signal or a driving power, can therefore provide various functions for the RF circuit 314. In one embodiment, the shielding structure 324 is grounded. For example, the shielding unit 322 of the shielding structure 306 is connected to a pad (not shown) for a grounding signal. In detail, the shielding unit 322 is connected to a interconnect unit (not shown), which can be a part of the metal interconnection system 321, and further connected to a pad (not shown) located above the metal interconnection system 321. The pad is connected to a grounding signal from another chip or a printed circuit board (PCB) by any connecting structure, for example, a bonding wire, a solder bump, or a redistribution layer (RLD). Since the shielding structure 324, including the TST 310 and the shielding unit 322, encompasses the RF circuit 314 and the TSV 312, it can effectively eliminate the phenomenon of EMI from the RF circuit 314 and/or the TSV 312, thereby enhancing the performance of the devices.

Figure 8:
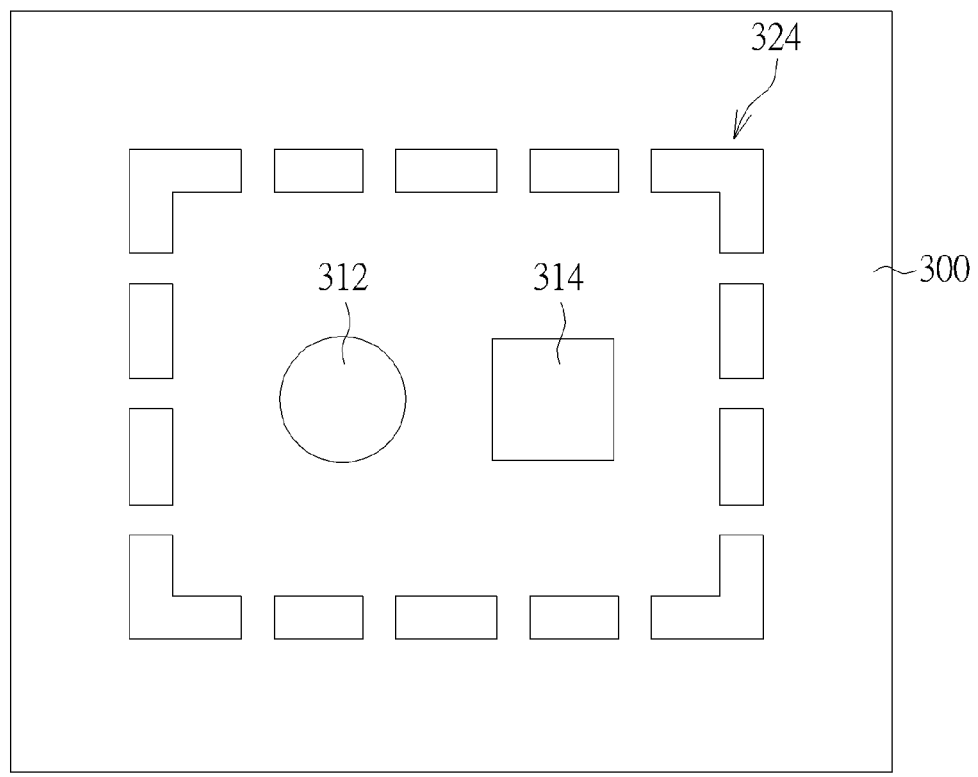
FIG. 8 and FIG. 9 illustrate schematic diagrams of the shielding structure according to different embodiments of the present invention.
Figure 9:
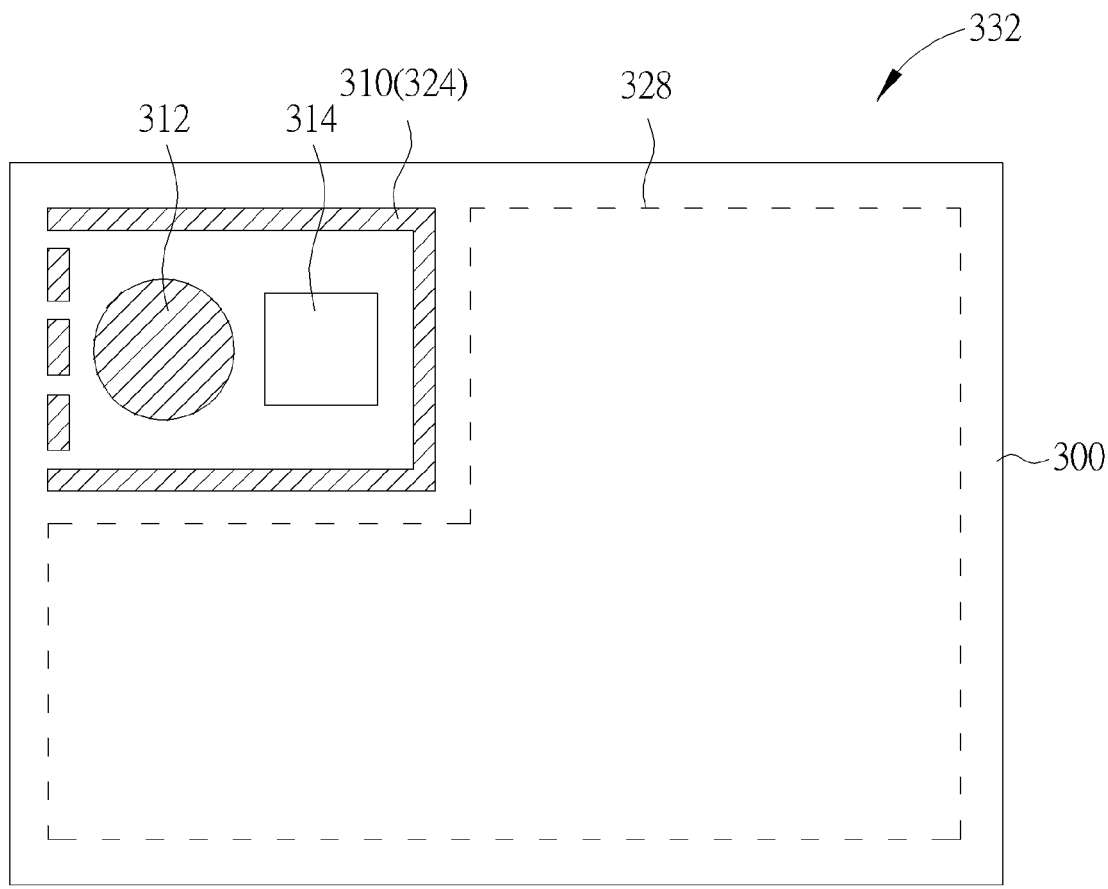

Please refer to FIG. 8 and FIG. 9, which show schematic diagrams of the shielding structure according to different embodiments of the present invention. As shown in FIG. 2, the layout of the shielding structure 324 is a closed circle which completely surrounds the RF circuit 314 (area A) and the TSV 312. In another embodiment, the shielding structure 324 comprises multiple portions and these multiple portions are arranged into a polygon contour delineated by a broken line. For example, as shown in FIG. 8, the layout of the shielding structure 324 is a rectangle delineated by a broken line. Alternatively, as shown in FIG. 9, the layout of the shielding structure 324 is a rectangle which comprises four edges (sides) and one edge (side) could be formed by a broken line. Alternatively, more than one edge (side) or a part of the edge (side) can be formed by a broken line. In one embodiment, as shown in FIG. 9, after a dicing process or a package, a plurality of chips 332 with shielding structure 324 are formed and the shielding structure 324 preferably is disposed close to an edge of the chip 332, preferably to a corner of the chip 332. Specifically, there is no other active circuit (such as circuit 328) disposed between the edge of the substrate 300 and RF circuit 314 (except other electrostatic protection devices). It should be noted that the foregoing embodiments of the shielding structure 324 are mainly refer to the TST 310 of the shielding structure 324. In one preferable embodiment, the layout of the TST 310 is the same as that of the shielding unit 322. However, according to the design of the product, the layouts thereof can be different.

Figure 10:
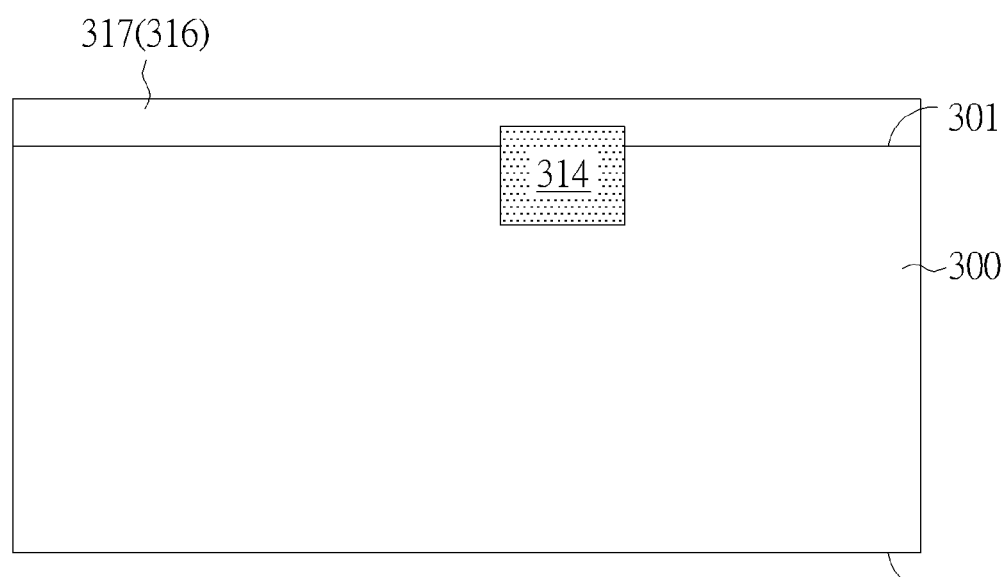
FIG. 10 to FIG. 13 illustrate schematic diagrams of the method of forming a semiconductor device having a TSV for interconnection and a shield structure according to another embodiment of the present invention.

The previous embodiment shows the TST 310 and the TSV 312 are formed by a "via first" process, that is, the TST 310 and the TSV 312 are formed before the dielectric layer 316. In another embodiment, the TST 310 and the TSV 312 are formed by a "via middle" process, showing that TST 310 and the TSV 312 are formed after a part of the dielectric layer 316 and then the other part of the dielectric layer 316 are formed. Please refer to FIG. 10 to FIG. 13, which illustrate schematic diagrams of the method of forming a semiconductor device having a TSV for interconnection and a shield structure according to another embodiment of the present invention. For the sake of simplicity, same reference numerals are used to refer to the same or similar components in this embodiment. As shown in FIG. 10, a substrate 300 with an active surface 301 and a back surface 303 is provided. An RF circuit 314 is formed in and/or on the active surface 301 of the substrate 300. Subsequently, a part of the dielectric layer 316, such as an inter-electric (ILD) layer 317, is formed on the substrate 300 to cover the RF circuit 314.

Figure 11:
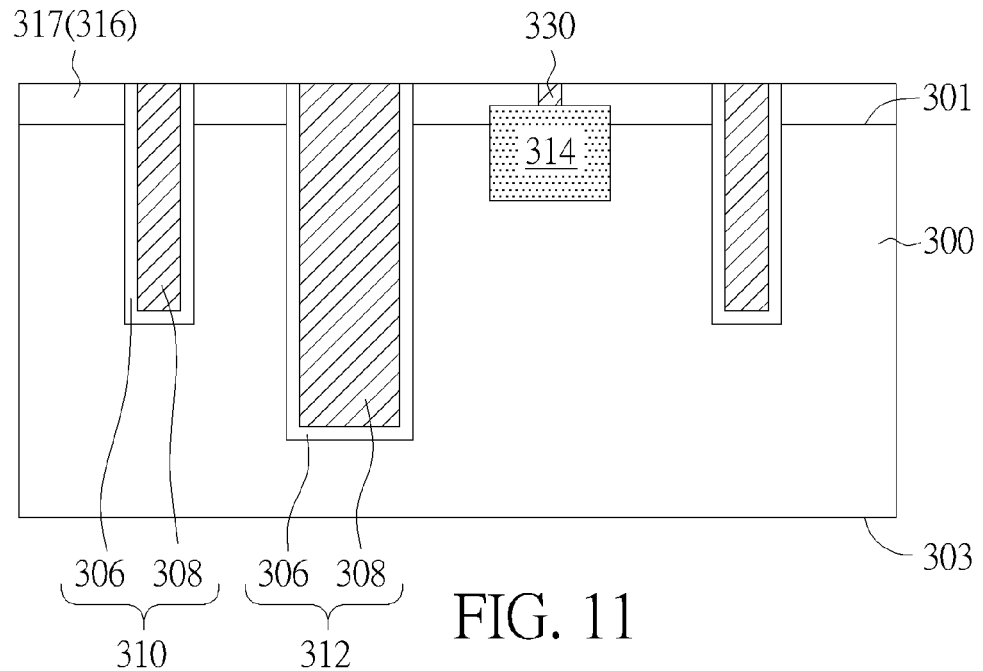

With reference to FIG. 11, the TST 310 and the TSV 312 are formed simultaneously on the substrate 300. The steps of forming TST 310 and the TSV 312 (including the conductive layer 306 and the insulation layer 308) are similar to the steps in FIG. 3 to FIG. 5 and are not repeated. In the present embodiment, it is noted that since the ILD layer 317 is formed before the TST 310 and TSV 312, the TST 310 and TSV 312 penetrate the ILD layer 317. In the present embodiment, a part of the step for forming a contact plug 330, which is electrically connected to the RF circuit 330, can be incorporated into the step for forming the TST 310 and the TSV 312. For example, by adjusting the width of the contact plug 330, a contact via (not shown in the figure), the via 302 and the trench 304 in FIG. 2 can be formed simultaneously. Alternatively, the conductive layer 308 can be simultaneously filled into the contact via to form the contact plug 330, and be filled into the via 302 and the trench 304 respectively to form the TSV 310 and the TSV 312.

Figure 12:
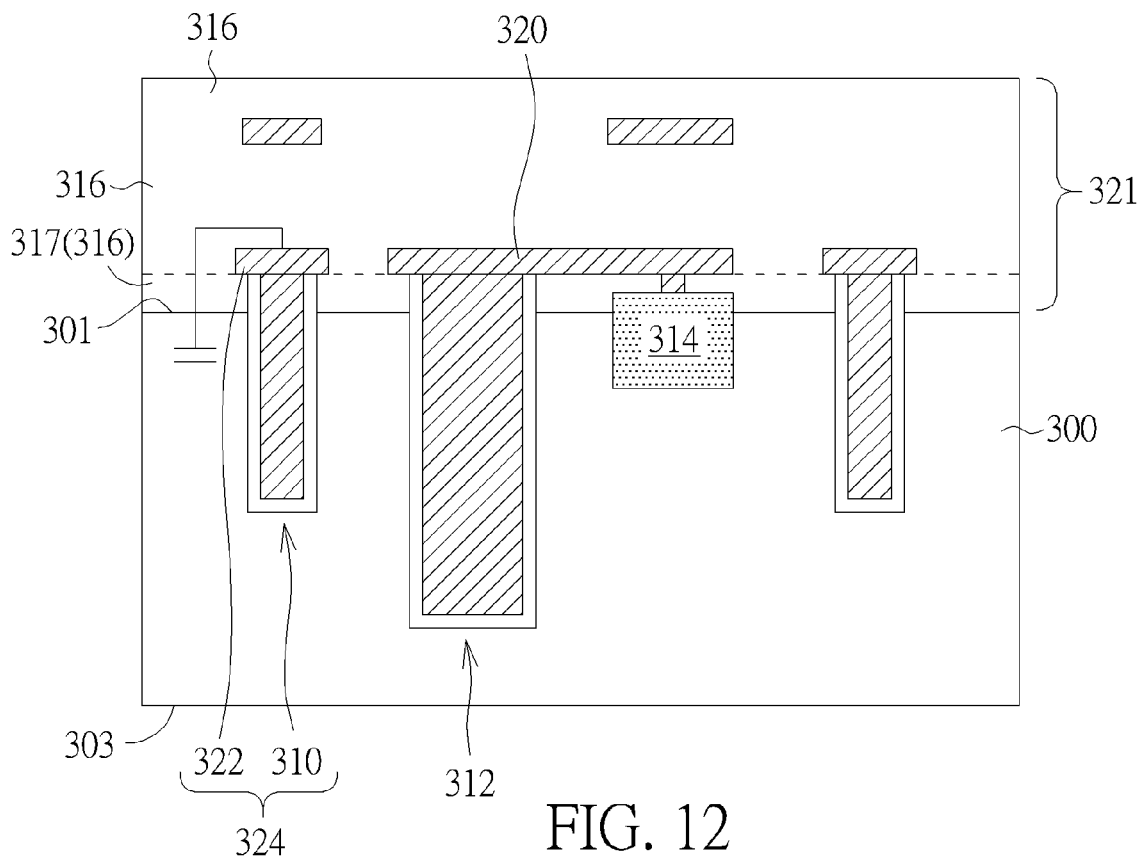
Figure 13:
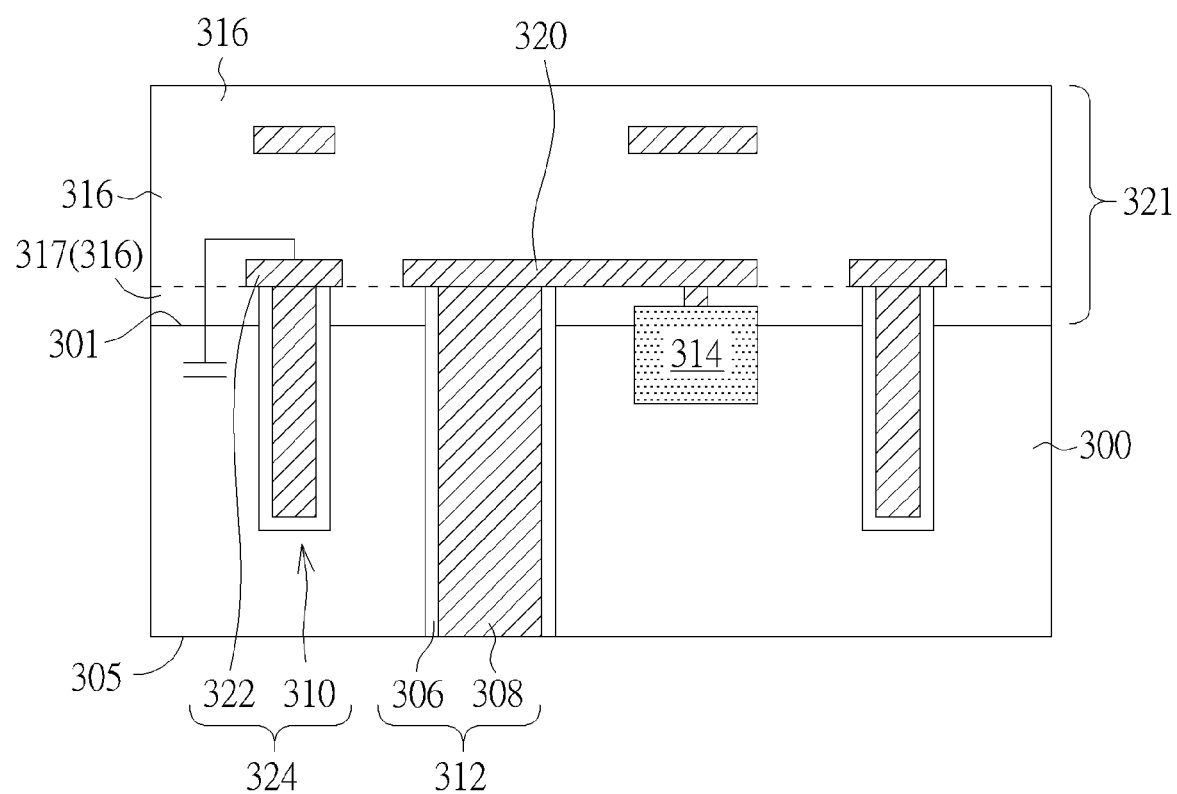

Next, a shown in FIG. 12, the remained part the dielectric layer 316 and the metal interconnection system 321, including the connection unit 320 and the optional shielding unit 322 are formed on the ILD 317. Thereafter, as shown in FIG. 13, a thinning process is carried out from the back surface 303 of the substrate 300 to expose the TSV 312 but not expose the TST 310. The shielding structure 324 and the TSV 312 for connection are therefore formed.

In summary, the present invention provides a semiconductor device having a shielding structure, which can effectively eliminate the phenomenon of EMI from the RF circuits, and a TSV for signal connection. The present invention further provides a variety of embodiments for the shielding structure and the method of forming the same.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a through silicon via for signal and a shielding structure, comprising:

providing a substrate, wherein a region is defined on the substrate;

forming an radio frequency (RF) circuit in the region on the substrate;

forming a through silicon trench (TST) and a through silicon via (TSV) simultaneously, wherein the TST encompasses the region; and forming a metal interconnection system on the substrate, wherein the metal interconnection system comprises a connection unit that electrically connects the TSV to the RF circuit to provide a voltage signal, and the TST serve as a shielding structure for the RF circuit wherein the step of simultaneously forming the TST and the TSV comprises simultaneously forming a trench and a via, wherein the trench encompasses the via.

2. The method for forming the TSV for signal and the shielding structure according to claim 1, wherein a depth of the TST is smaller than a depth of the TSV.

3. The method for forming the TSV for signal and the shielding structure according to claim 1, wherein a width of the TST is smaller than a width of the TSV.

4. The method for forming the TSV for signal and the shielding structure according to claim 1, wherein a layout of the TST is a closed polygon.

5. The method for forming the TSV for signal and the shielding structure according to claim 1, wherein a layout of the TST is a discontinuous polygon.

6. The method for forming the TSV for signal and the shielding structure according to claim 1, wherein a layout of the TST has an opening.

7. The method for forming the TSV for signal and the shielding structure according to claim 6, wherein from a top view of the substrate, there is no circuit disposed between the opening and the closest edge of the substrate.

8. The method for forming the TSV for signal and the shielding structure according to claim 1, wherein the step of simultaneously forming the TST and the TSV further comprises:

simultaneously forming an insulation layer conformally on a surface of the trench and a surface of the via;

filling a conductive layer into the trench and the via; and removing the conductive layer and the insulation layer outside the trench and the via, thereby forming the TST in the trench and the TSV in the via.

9. The method for forming the TSV for signal and the shielding structure according to claim 1, wherein the step of simultaneously forming the TST and the TSV further comprises:

forming an insulation layer conformally on a surface of the trench and a surface of the via;

simultaneously filling a conductive layer into the trench and the via; and removing the conductive layer and the insulation layer outside the trench and the via, thereby forming the TST in the trench and the TSV in the via.

10. The method for forming the TSV for signal and the shielding structure according to claim 1, wherein the TST and the TSV are formed before the RF circuit is formed.

11. The method for forming the TSV for signal and the shielding structure according to claim 1, wherein the TST and the TSV are formed after the RF circuit is formed.

12. The method for forming the TSV for signal and the shielding structure according to claim 1, further comprising forming a dielectric layer on the substrate.

13. The method for forming the TSV for signal and the shielding structure according to claim 12, wherein the TST and the TSV are formed before the dielectric layer is formed.

14. The method for forming the TSV for signal and the shielding structure according to claim 12, wherein the dielectric layer comprises an inter-dielectric (ILD) layer directly contacting the substrate, and the TST and the TSV are formed after the ILD layer is formed.

15. The method for forming the TSV for signal and the shielding structure according to claim 14, further comprising forming a contact plug that is disposed in the ILD layer and is connected to the RF circuit, wherein the contact plug, the TST and the TSV are formed simultaneously.

16. The method for forming the TSV for signal and the shielding structure according to claim 1, wherein the metal interconnection system further comprises a shielding unit that is electrically connected to the TST, and the shielding unit and the TST together form the shielding structure.

17. The method for forming the TSV for signal and the shielding structure according to claim 1, further comprising performing a thinning process upon a back side of the substrate, thereby exposing the TSV.

18. The method for forming the TSV for signal and the shielding structure according to claim 17, wherein the thinning process does not expose the TST.

19. The method for forming the TSV for signal and the shielding structure according to claim 1, wherein the shielding structure is grounded.

* * * * *